(12) United States Patent
Yamashita

(10) Patent No.: US 10,663,489 B2
(45) Date of Patent: May 26, 2020

(54) WAVEFORM DISPLAY DEVICE

(71) Applicant: Yokogawa Electric Corporation, Musashino-shi, Tokyo (JP)

(72) Inventor: Takeshi Yamashita, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 226 days.

(21) Appl. No.: 15/848,443

(22) Filed: Dec. 20, 2017

(65) Prior Publication Data
US 2018/0203043 A1   Jul. 19, 2018

(30) Foreign Application Priority Data
Jan. 16, 2017   (JP) ................................ 2017-005127

(51) Int. Cl.
| | |
|---|---|
| *G01R 13/02* | (2006.01) |
| *G06F 3/0485* | (2013.01) |
| *G06F 3/033* | (2013.01) |
| *G06T 11/20* | (2006.01) |
| *G06F 3/0484* | (2013.01) |
| *G06F 3/0481* | (2013.01) |

(52) U.S. Cl.
CPC ..... *G01R 13/0218* (2013.01); *G01R 13/0236* (2013.01); *G01R 13/0245* (2013.01); *G06F 3/033* (2013.01); *G06F 3/0485* (2013.01); *G06F 3/04812* (2013.01); *G06F 3/04845* (2013.01); *G06T 11/206* (2013.01)

(58) Field of Classification Search
CPC .................................................. G01R 13/0218
USPC .......................................................... 702/68
See application file for complete search history.

(56) References Cited

U.S. PATENT DOCUMENTS

| | | | | |
|---|---|---|---|---|
| 5,284,152 A | * | 2/1994 | Portnuff | G16H 40/63 600/525 |
| 5,956,013 A | * | 9/1999 | Raj | A61B 5/044 345/208 |
| 6,359,620 B1 | * | 3/2002 | Fujita | G01R 13/30 345/208 |

(Continued)

FOREIGN PATENT DOCUMENTS

| | | |
|---|---|---|
| JP | 04139542 A | 5/1992 |
| JP | 5-5754 A | 1/1993 |

(Continued)

*Primary Examiner* — Ricky Ngon
(74) *Attorney, Agent, or Firm* — Sughrue Mion, PLLC

(57) ABSTRACT

A waveform display device includes: an operation accepting unit for accepting operation by a user; and a display controller for generating waveform display screen including a program pattern waveform for program control and an actual measurement waveform based on measurement data obtained as a result of the program control, with the program pattern waveform and the actual measurement waveform being superimposed on each other, and a cursor indicating a section between a past time area showing a program pattern waveform and an actual measurement waveform in the past time and a future time area showing a future program pattern waveform. The operation accepting unit is configured to accept scroll operation for changing a position of the cursor in the waveform display screen. The display controller is configured to change the position of the cursor in the waveform display screen in accordance with the scroll operation.

9 Claims, 6 Drawing Sheets

(56) References Cited

U.S. PATENT DOCUMENTS

| | | | | |
|---|---|---|---|---|
| 2004/0024327 A1* | 2/2004 | Brodnick | ............ | A61B 5/04017 600/509 |
| 2004/0054296 A1* | 3/2004 | Ramseth | ................ | A61B 5/044 600/509 |
| 2004/0095350 A1* | 5/2004 | Kamiyama | .......... | G01R 13/029 345/441 |
| 2012/0290879 A1* | 11/2012 | Shibuya | ................. | G06N 20/00 714/26 |
| 2015/0235394 A1* | 8/2015 | Ben-Oni | ............... | G06T 11/203 345/440.1 |
| 2015/0235395 A1* | 8/2015 | Ben-Oni | ............... | G06T 11/206 345/440.1 |
| 2015/0243040 A1* | 8/2015 | Ben-Oni | ............... | G06T 11/206 345/629 |
| 2017/0285902 A1* | 10/2017 | Patel | ..................... | G06F 3/0486 |

FOREIGN PATENT DOCUMENTS

| | | | |
|---|---|---|---|
| JP | 7-56961 A | 3/1995 | |
| JP | 2004-219239 A | 8/2004 | |
| JP | 2008070295 A | 3/2008 | |
| JP | 2014-215081 A | 11/2014 | |

* cited by examiner

WAVEFORM DISPLAY DEVICE

CROSS-REFERENCE TO RELATED APPLICATION

This application claims priority from Japanese Patent Application No. 2017-005127 filed with the Japan Patent Office on Jan. 16, 2017, the entire content of which is hereby incorporated by reference.

BACKGROUND

1. Technical Field

The present disclosure relates to a waveform display device.

2. Description of the Related Art

There are devices that handle measurement values obtained in temporal sequence such as paperless recorder, waveform measuring instrument, and measurement data management device. Generally, such a device can operate as a waveform display device that displays waveform of measurement values on a display. A waveform display device stores time-series measurement data and displays waveform of measurement values on a display unit provided therein or an external display unit connected to the waveform display device. With the use of a waveform display device, a user can visually understand temporal change of measurement values.

Some waveform display devices in practical use have a program control function as an additional function. A waveform display device with a program control function accepts setting of program pattern that determines a process for controlling a controlled object from a user in advance, and can provide control operation in accordance with the program pattern. In the program pattern, for example, temporal change in temperature, voltage, and the like is defined in a predetermined format.

In a waveform display device with a program control function, waveform indicating the set program pattern (program pattern waveform) and waveform of an actual measurement value obtained as a result of the program control in accordance with the program pattern (actual measurement waveform) are displayed, with the waveform indicating the set program pattern and the waveform of an actual measurement value being superimposed on each other.

FIGS. 6A to 6C show examples of a display on which the actual measurement waveform and the program pattern waveform are displayed (waveform display screen), with the actual measurement waveform and the program pattern waveform being superimposed on each other. The actual measurement waveform is shown by solid line and the program pattern waveform is shown by broken line. With respect to the time axis that is the horizontal axis of the waveform display screen, the right direction indicates newer time.

The position of the latest data of the actual measurement waveform is indicated by straight line orthogonal to the time axis that is referred to as cursor. Therefore, the waveform area before (to the left of) the cursor position is the past time area that indicates the waveform in the past time. The waveform area after (to the right of) the cursor position is the future time area that indicates the future change of the target value set by the program pattern (future program pattern waveform). In the past time area, both of the actual measurement waveform and the past program pattern waveform are displayed. In the future time area, only the future program pattern waveform is displayed.

In the waveform display device, the waveform is scrolled together with the time axis as the time passes. In the waveform display device on which the program pattern waveform is displayed, following display is generally provided. That is, immediately after start of measurement, as shown in FIG. 6A, the actual measurement waveform (actual measurement value waveform) extends from the left end. Because the actual measurement value is small, the future time area where only the future program pattern waveform is displayed occupies most part of the waveform display screen. Thereafter, the actual measurement waveform extends in the right direction as the time passes. Together with that, the cursor moves in the right direction and the ratio of the past time area increases. Meanwhile, the program pattern waveform itself does not change.

As shown in FIG. 6B, when the actual measurement waveform extends in the right direction, the past time area becomes larger than the future time area in some degree, and the cursor reaches the predetermined stop position, movement of the cursor stops. After movement of the cursor stops, as shown in FIG. 6C, the cursor position is fixed and the actual measurement waveform and the program pattern waveform move in the left direction based on the cursor as the time passes.

The technique of this field is disclosed in JP-A-2014-215081, for example.

SUMMARY

A waveform display device includes: an operation accepting unit for accepting operation by a user; and a display controller for generating waveform display screen including a program pattern waveform for program control and an actual measurement waveform based on measurement data obtained as a result of the program control, with the program pattern waveform and the actual measurement waveform being superimposed on each other, and a cursor indicating a section between a past time area showing a program pattern waveform and an actual measurement waveform in the past time and a future time area showing a future program pattern waveform. The operation accepting unit is configured to accept scroll operation for changing a position of the cursor in the waveform display screen, and the display controller is configured to change the position of the cursor in the waveform display screen in accordance with the scroll operation.

DESCRIPTION OF THE EMBODIMENTS

Figure 1:
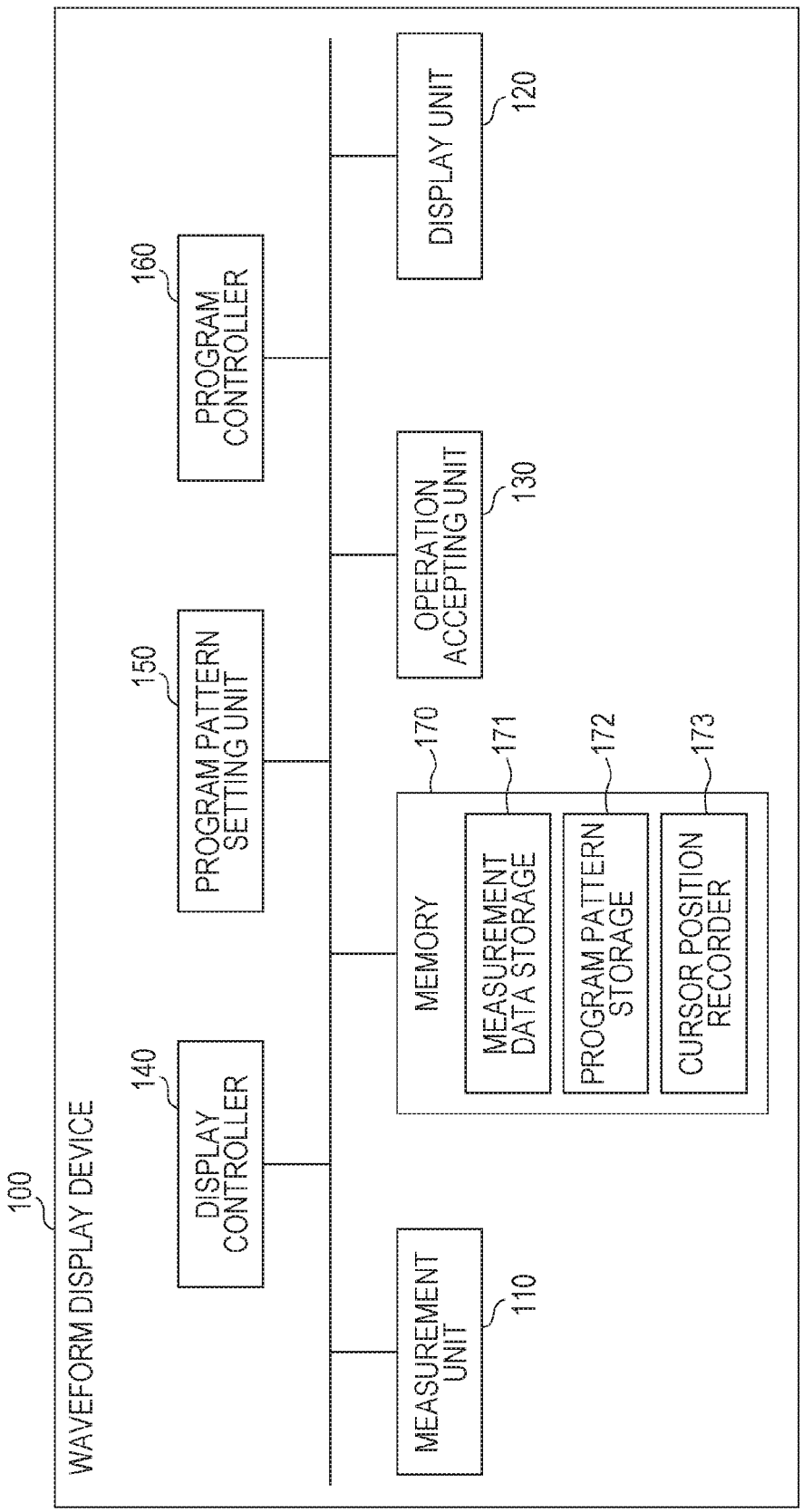
FIG. 1 is a block diagram illustrating a configuration of a waveform display device according to the present embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As described above, in a general waveform display device for displaying program pattern waveform, a cursor moves together with the extension of actual measurement waveform from the start of measurement. After the cursor reaches the stop position, the ratio between the past time area and the future time area is fixed.

In such a fixed display, it is difficult to easily change the waveform display range when the user wants to retroactively observe the actual measurement waveform over the displayed time range and when the user wants to confirm future change of the program pattern waveform. Therefore, operability on the waveform display range has not been sufficient.

An object of the present disclosure is to provide a waveform display device for displaying program pattern waveform for program control having high operability on the waveform display range.

A waveform display device according to one aspect of the present disclosure includes: an operation accepting unit for accepting operation by a user; and a display controller for generating waveform display screen including a program pattern waveform for program control and an actual measurement waveform based on measurement data obtained as a result of the program control, with the program pattern waveform and the actual measurement waveform being superimposed on each other, and a cursor indicating a section between a past time area showing a program pattern waveform and an actual measurement waveform in the past time and a future time area showing a future program pattern waveform. The operation accepting unit is configured to accept scroll operation for changing a position of the cursor in the waveform display screen. The display controller is configured to change the position of the cursor in the waveform display screen in accordance with the scroll operation.

The operation accepting unit may be configured to accept cursor position restoration operation for setting the position of the cursor to a predetermined initial position, and the display controller ay be configured to set the position of the cursor to the initial position in accordance with the cursor position restoration operation.

The display controller may be configured to set the position of the cursor to a predetermined initial position after a predetermined time has elapsed since the position of the cursor has been changed.

The waveform display device may further include a display unit for displaying the waveform display screen.

According to the aspect described above, it is possible to provide a waveform display device for displaying program pattern waveform for program control having operability on the waveform display range.

An embodiment of the present disclosure will be described with reference to the drawings. FIG. 1 is a block diagram illustrating a configuration of a waveform display device 100 according to the present embodiment. Note that, the waveform display device according to the present embodiment can be applied to various electronic devices such as paperless recorder, waveform measuring instrument, measurement data management device, and PC (personal computer) with waveform display software installed therein.

The waveform display device 100 has a program control function. That is, the waveform display device 100 accepts setting of program pattern for program control that determines process of controlling a controlled object from the user in advance, and can perform control (measurement) in accordance with the program pattern. In the program pattern, for example, temporal change of temperature, voltage, and the like is defined by a predetermined format.

As illustrated in FIG. 1, the waveform display device 100 includes a measurement unit 110, a display unit 120, an operation accepting unit 130, a display controller 140, a program pattern setting unit 150, a program controller 160, and a memory 170. However, the display unit 120 and the operation accepting unit 130 may be connected to the waveform display device 100 as external devices.

The measurement unit 110 inputs a measurement signal from an external device for measurement such as sensor, and converts the measurement signal to measurement data (measurement value) by predetermined processing such as AD conversion. The measurement unit 110 may directly input measurement data from an external device for measurement. This measurement data (measurement value) is measurement data (actual measurement value) that is obtained as a result of program control in accordance with the program pattern.

The display unit 120 includes a liquid crystal panel and the like and displays waveform display screen. The operation accepting unit 130 includes operation units such as operation key and/or mouse and accepts operation from the user (instruction from the user). The display unit 120 and the operation accepting unit 130 may be a touch panel integrating these units.

The display controller 140 generates waveform display screen to be displayed on the display unit 120. That is, the display controller 140 generates waveform display screen including: waveform indicating program pattern for program control (program pattern waveform for program control) and actual measurement waveform based on the measurement data obtained as a result of program control, with the waveform and the actual measurement waveform being superimposed on each other: and a cursor indicating a section between the past time area and the future time area to be displayed on the display unit 120.

FIGS. 3A to 3C and FIGS. 4A to 4C show examples of waveform display screen according to the present embodiment. As shown in these drawings, for example, actual measurement waveform is shown by solid line and program pattern waveform is shown by broken line. In addition, with respect to the time axis which is the horizontal axis of waveform display screen, the right direction indicates new time.

The position of the latest data of the actual measurement waveform is shown by a cursor (straight line orthogonal to the time axis). Therefore, the waveform area before (to the left of) the cursor position is the past time area showing the waveform in the past. The waveform area after (to the right of) the cursor position is the future time area indicating future change (future program pattern waveform) of the target value set by the program pattern. In the past time area, actual measurement waveform and program pattern waveform in the past are displayed. In the future time area, future program pattern waveform is displayed.

As described, in the waveform display screen, the past time area, the future time area, and the cursor indicating a section between these areas are displayed.

The program pattern setting unit 150 accepts operation (instruction) regarding setting of program pattern for program control from the user via the operation accepting unit 130 and sets program pattern. The program controller 160 performs program control in accordance with the set program pattern.

Note that, actual program control (setting of program pattern and control (measurement) accordance with the program pattern) may be performed by a device other than the waveform display device 100. In such a case, the waveform display device 100 may not include the measurement unit 110, the program pattern setting unit 150, and the program controller 160. In such a case, the waveform display device 100 may obtain program pattern and measurement data (measurement value) from other devices that perform program control.

The memory 170 includes a measurement data storage 171, a program pattern storage 172, and a cursor position recorder 173. The measurement data storage 171 stores time-series measurement value output from the measurement unit 110 in a predetermined file format. The program pattern storage 172 stores program pattern accepted and set by the program pattern setting unit 150. The cursor position recorder 173 records cursor position (time axis coordinates) in the waveform display screen.

Figure 2:
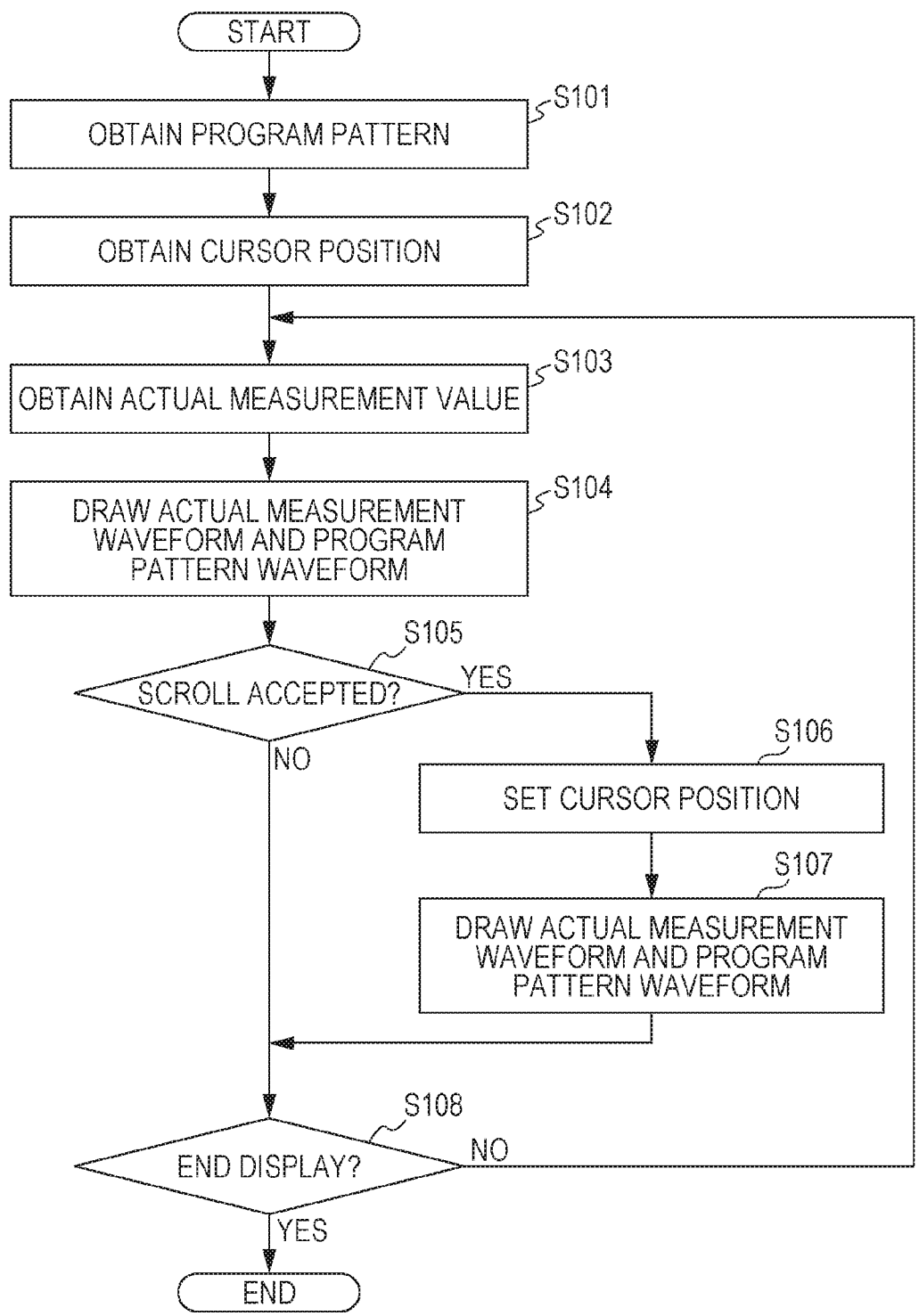
FIG. 2 is a flow chart for describing control of waveform display screen in the waveform display device illustrated in FIG. 1.

Next, process for controlling the waveform display screen in the waveform display device 100 according to the present embodiment will be described with reference to the flow chart of FIG. 2. In this process, the program pattern waveform and the actual measurement waveform are displayed on the waveform display screen, with the program pattern waveform and the actual measurement waveform being superimposed on each other. This process is performed by control of the display controller 140.

Note that, prior to waveform display, the program pattern is set based on operation by the user (instruction from the user) and stored in the program pattern storage 172.

The display controller 140 obtains the program pattern stored in the program pattern storage 172 (S101). The program pattern may be referenced as necessary.

In addition, the display controller 140 obtains the cursor position recorded in the cursor position recorder 173 (S102). In the present embodiment, the cursor position is any position on the time axis in the waveform display screen. Then, the user can freely move the cursor position at any timing. Accordingly, the user can freely change the ratio of display between the past time area and the future time area. As a result, operability on waveform display range is improved.

As for cursor position, for example, any (predetermined) cursor position is initial position (predetermined initial position). When the cursor position is changed by the user, the cursor position after the change is recorded in the cursor position recorder 173.

Note that, the operation accepting unit 130 may be configured to accept cursor position restoration operation for setting (returning) the cursor position to the predetermined initial position. In this case, the display controller 140 may be configured to set (return) the cursor position to the initial position in accordance with the cursor position restoration operation.

For example, a button for returning the cursor (cursor position) to the initial position (cursor position restoration button) may be provided to the operation accepting unit 130.

In this case, the display controller 140 returns the cursor position to the initial position when the user operates the cursor position restoration button.

In addition, the display controller 140 may be configured to set (return) the cursor position to the initial position after the predetermined time has elapsed. In this case, for example, the display controller 140 sets (returns) the cursor position to the predetermined initial position after the predetermined time has elapsed since the cursor position has been changed.

After measurement is started, the display controller 140 sequentially obtains actual measurement value from the measurement data storage 171 (S103). Then, the display controller 140 generates waveform display screen based on the cursor position recorded in the cursor position recorder 173 to be displayed on the display unit 120. That is, the display controller 140 draws (generates) actual measurement waveform and program pattern waveform based on the cursor position. Moreover, the display controller 140 generates waveform display screen including the drawn (generated) actual measurement waveform and program pattern waveform and the cursor to be displayed on the display unit 120 (S104).

The operation accepting unit 130 is configured to accept scroll operation (scroll operation of waveform display screen) for changing the position of the cursor in the waveform display screen from the user. The scroll operation includes the scroll direction and the scroll amount of the cursor, for example.

The display controller 140 can accept the scroll operation via the operation accepting unit 130. The display controller 140 is configured to change the position of the cursor in the waveform display screen in accordance with scroll operation.

That is, when the scroll operation is accepted (S105: Yes), the display controller 140 moves the cursor based on the scroll direction and the scroll amount included in this scroll operation and sets the cursor position after move. The display controller 140 records the moved cursor position in the cursor position recorder 173 (S106). Here, the display controller 140 can accept the scroll operation by operation of a scroll key provided to the operation accepting unit 130, drag of a mouse provided to the operation accepting unit 130, and/or swipe operation to a touch panel provided to the operation accepting unit 130, for example.

Then, the display controller 140 re-draws actual measurement waveform and program pattern waveform based on the moved cursor position. For example, the display controller 140 displays waveform display screen including the re-drawn actual measurement waveform and program pattern waveform and the moved cursor on the display unit 120 (S107).

On the other hand, when the scroll operation of the waveform display screen from the user is not accepted (S105: No), the display controller 140 fixes the cursor position and does not move the cursor. As a result, waveform moves based on the cursor.

The waveform display device 100 (display controller 40 repeats process of S103 until after waveform display ends (S108: Yes), at least one of the predetermined waveform update periods (S108).

Figure 3A:
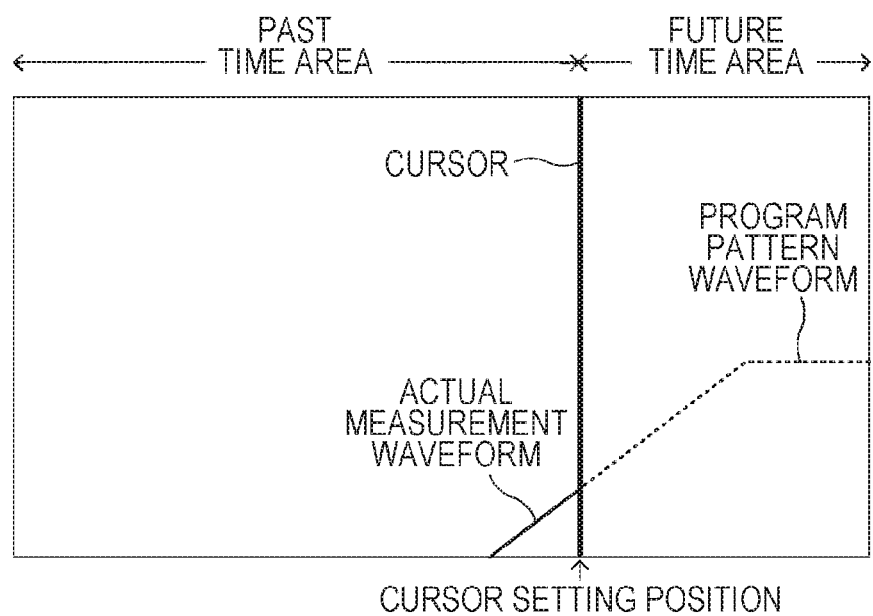
FIGS. 3A to 3C show waveform display screen when scroll operation is not performed.
Figure 3B:
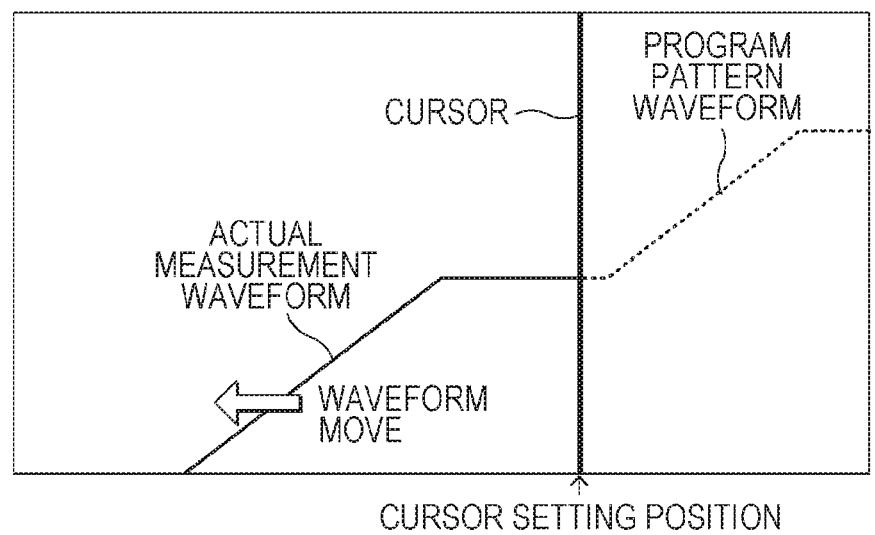
Figure 3C:
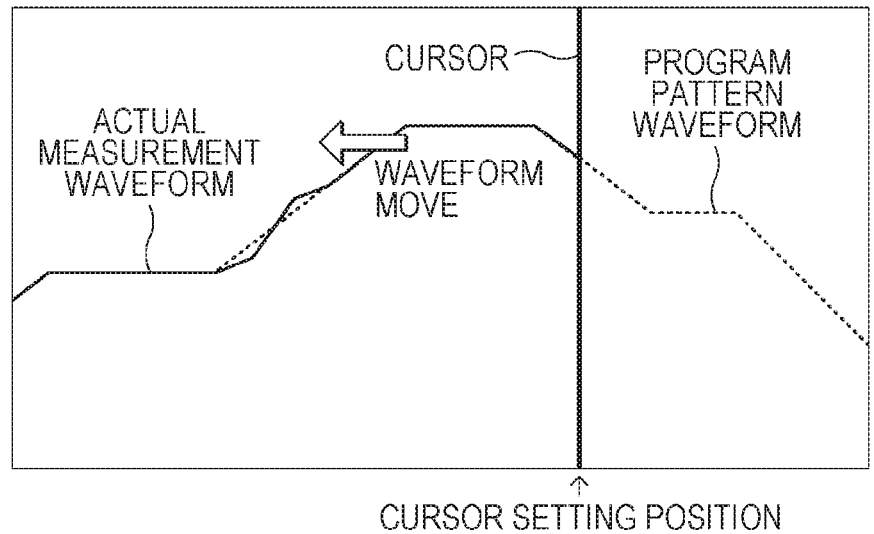

An example of process for controlling display of such waveform display screen will be described. For example, assuming that scroll operation of cursor is not performed when the cursor position is set to a cursor stop position (cursor setting position) as shown in FIG. 3A. In this case, as shown in FIGS. 3B and 3C, the cursor position is fixed regardless of progress of measurement. Actual measurement waveform and program pattern waveform move based on the cursor.

Figure 4A:
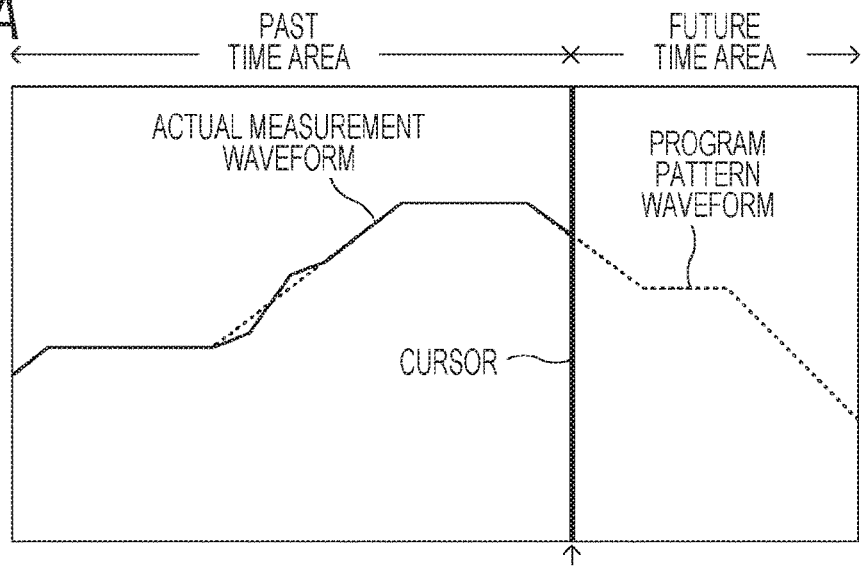
FIGS. 4A to 4C show waveform display screen when scroll operation is performed.
Figure 4B:
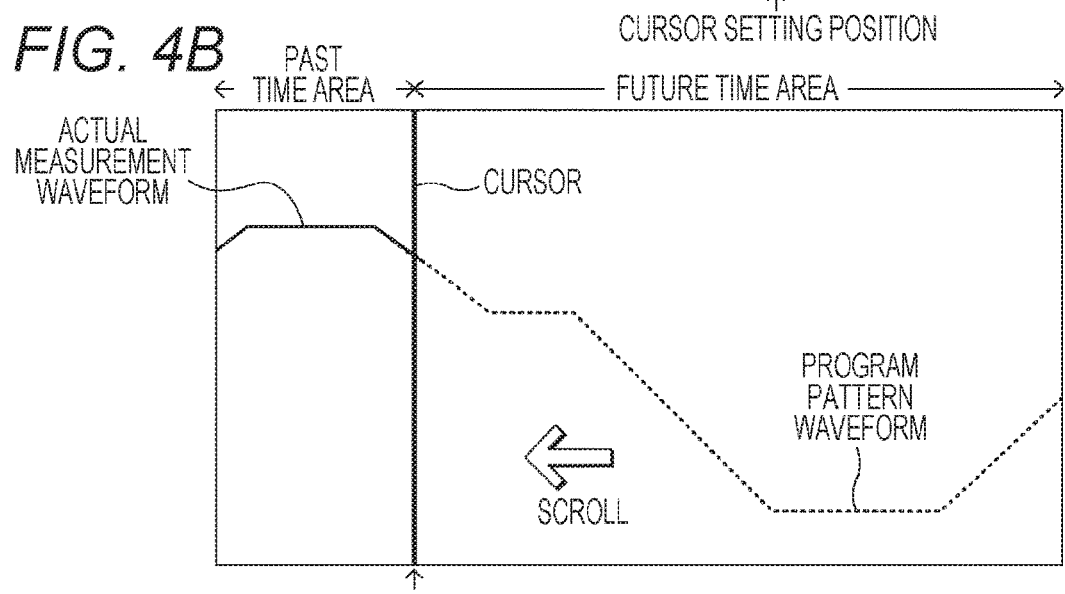
Figure 4C:
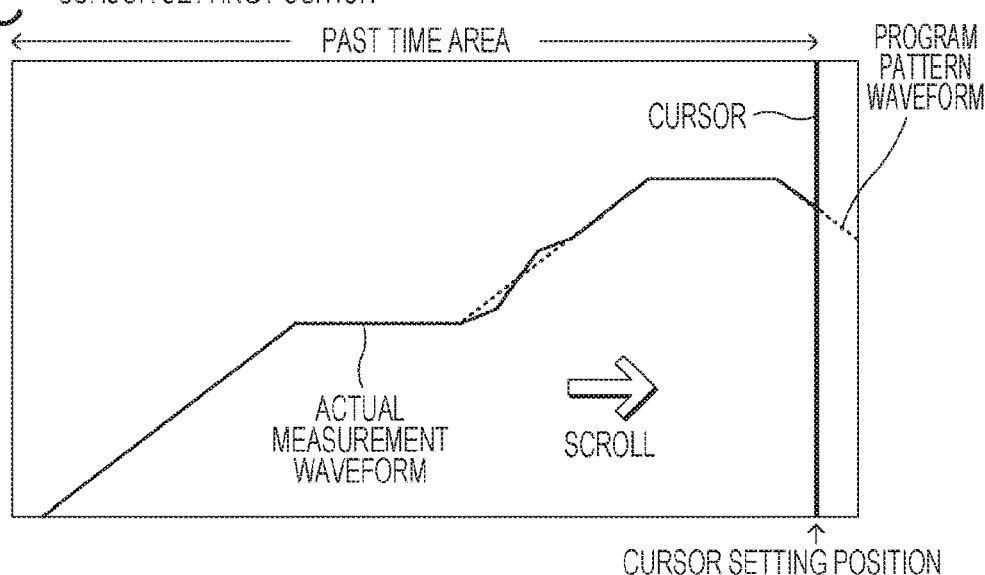

On the other hand, when scroll operation is accepted, the cursor (cursor setting position) move in accordance with the scroll direction and the scroll amount as shown in FIGS. 4A to 4C. Accordingly, the ratio between the past time area and the future time area is changed. FIG. 4B shows an example in which the ratio of the past time area is small. FIG. 4C shows an example in which the ratio of the past time area is large. According to the waveform display device 100 of the present embodiment, the user can easily display the waveform in the range he/she desires by scroll operation, which is intuitive operation.

Figure 5:
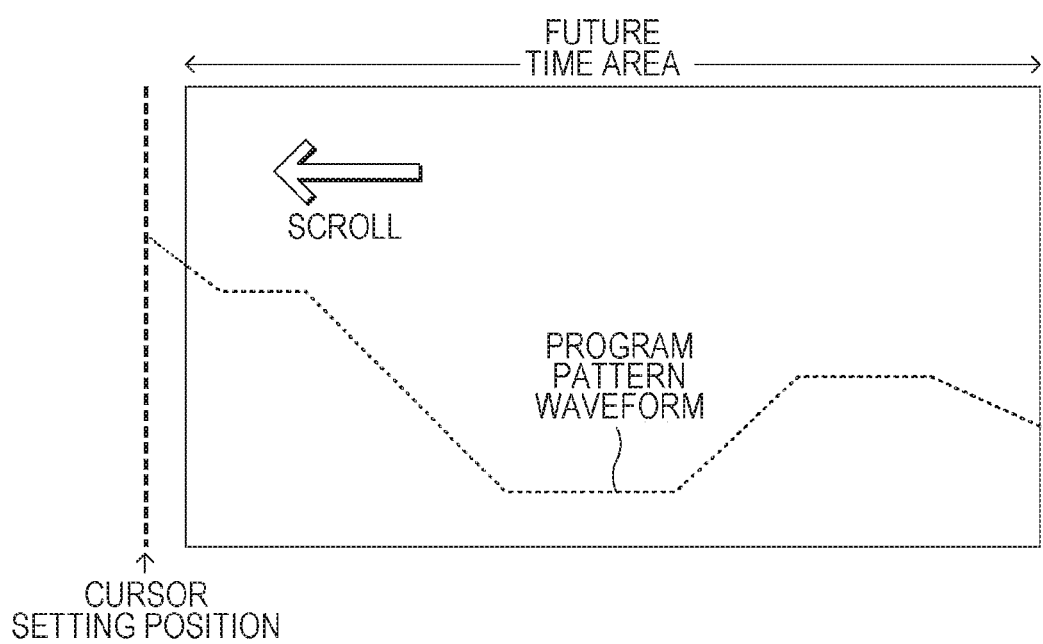
FIG. 5 illustrates a case in which a cursor is moved outside the display area.
Figure 6A:
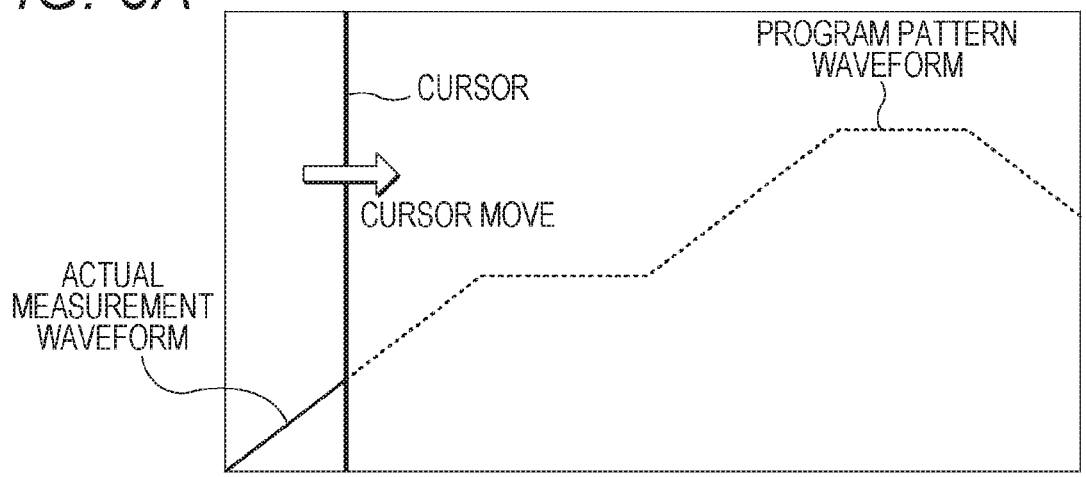
FIGS. 6A to 6C describe a general waveform display device for displaying program pattern waveform.
Figure 6B:
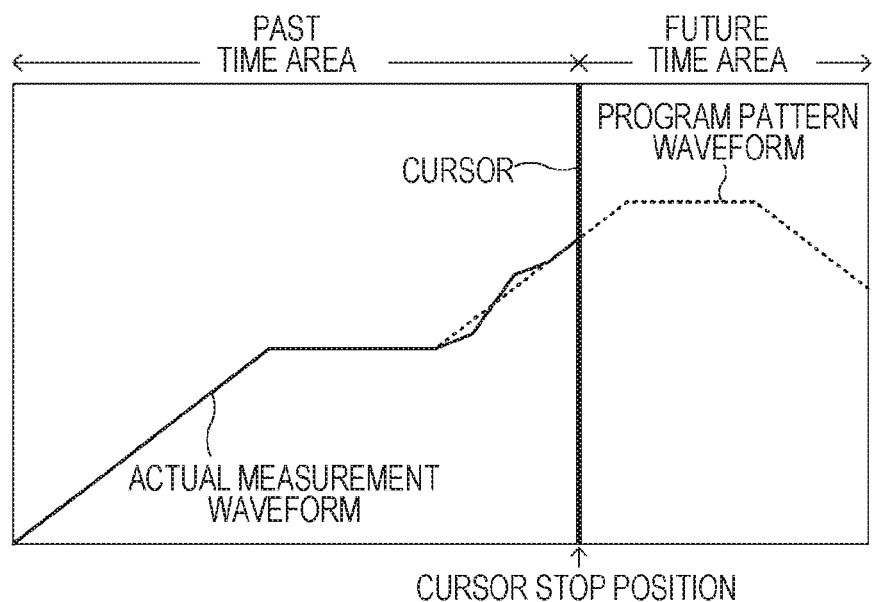
Figure 6C:
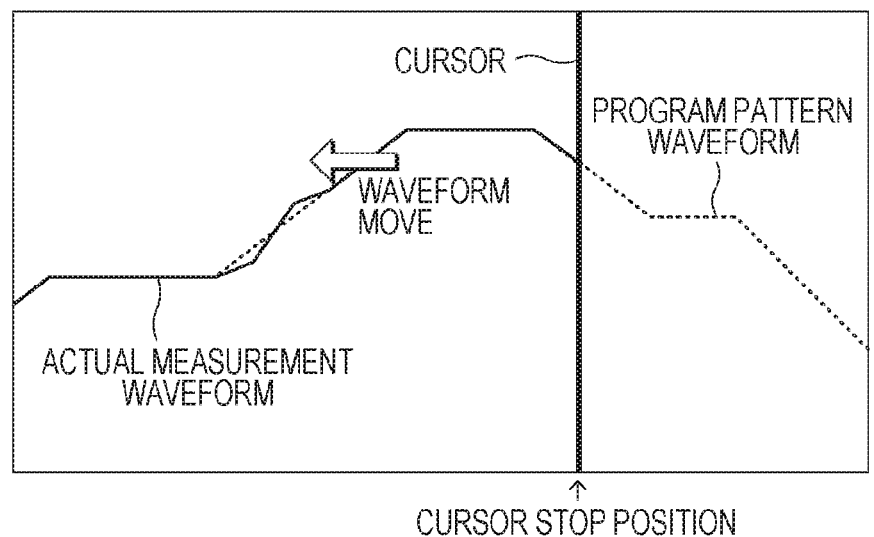

Note that, the cursor position can be moved outside the waveform display area as illustrated in FIG. 5. In this case, cursor is not displayed and one of the past time area and the future time area is displayed. In this case, the waveform in any range in the past time or the future time can be displayed on waveform display screen.

Note that, the display controller 140 may display waveform display screen on a display other than the waveform display device 100. In this case, the waveform display device 100 may not include the display unit 120.

The display controller 140 may superimpose the program pattern waveform for program control and the actual measurement waveform based on the measurement data obtained by the program control to generate waveform display screen with cursor indicating the section between the past time area and the future time area to be displayed on the display unit 120.

Actual program control may be performed by a device other than the waveform display device 100. In this case, the waveform display device 100 may obtain program pattern from another device that performs program control. The initial position of the cursor position may be known cursor stop position, for example. The display controller 140 may obtain cursor setting position in S102.

An embodiment of the present disclosure may be following first and second waveform display devices.

The first waveform display device is a waveform display device for displaying waveform on a waveform display screen with a cursor indicating the section between a past time area and a future time area, while a program pattern waveform for program control and an actual measurement waveform obtained by the program control are superimposed on each other. The waveform display device includes an operation accepting unit for accepting scroll operation in the time axis direction of the waveform display screen and a display controller for changing the ratio of display between the past time area and the future time area in the waveform display screen in accordance with the scroll operation.

In the second waveform display device according to the first waveform display device, the display controller moves the cursor to a predetermined initial position when the operation accepting unit accepts predetermined operation.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A waveform display device comprising:
    an operation accepting unit for accepting operation by a user; and
    a display controller for generating waveform display screen including a program pattern waveform for program control and an actual measurement waveform based on measurement data obtained as a result of the program control, with the program pattern waveform and the actual measurement waveform being superimposed on each other, and a cursor indicating a section between a past time area showing a program pattern waveform and an actual measurement waveform in the past time and a future time area showing a future program pattern waveform, wherein
    the operation accepting unit is configured to accept scroll operation for changing a position of the cursor in the waveform display screen, and
    the display controller is configured to change the position of the cursor in the waveform display screen in accordance with the scroll operation.

2. The waveform display device according to claim 1, wherein
    the operation accepting unit is configured to accept cursor position restoration operation for setting the position of the cursor to a predetermined initial position, and
    the display controller is configured to set the position of the cursor to the initial position in accordance with the cursor position restoration operation.

3. The waveform display device according to claim 1, wherein the display controller is configured to set the position of the cursor to a predetermined initial position after a predetermined time has elapsed since the position of the cursor has been changed.

4. The waveform display device according to claim 1, further comprising a display unit for displaying the waveform display screen.

5. The waveform display device according to claim 1, wherein the cursor divides the waveform display screen into two sections, a first section being the past time area, and a second section being the future time area.

6. The waveform display device according to claim 5, wherein the future time area shows only the future program pattern waveform and does not show the program pattern waveform and the actual measurement waveform.

7. The waveform display device according to claim 1, wherein the program pattern waveform indicates a program pattern that is set in advance by a user and determines a process for controlling a controlled object from which the measurement data is obtained.

8. The waveform display device according to claim 1, wherein the program pattern waveform indicates a program pattern that has been recorded in advance and determines a process for controlling a controlled object from which the measurement data is obtained.

9. The waveform display device according to claim 8, wherein the program pattern waveform has been recorded in an external device that is external to the waveform display device.

* * * * *